(12) United States Patent
Braswell et al.

(10) Patent No.: US 10,033,399 B1
(45) Date of Patent: Jul. 24, 2018

(54) DIGITAL TO ANALOG CONVERTER

(71) Applicant: NXP USA, INC., Austin, TX (US)

(72) Inventors: Brandt Braswell, Chandler, AZ (US); George Rogers Kunnen, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/717,180

(22) Filed: Sep. 27, 2017

(51) Int. Cl.
*H03M 1/06* (2006.01)
*H03M 3/00* (2006.01)

(52) U.S. Cl.
CPC ........... *H03M 3/372* (2013.01); *H03M 3/464* (2013.01)

(58) Field of Classification Search
CPC ............................. H03M 3/372; H03M 3/464
USPC .................................................. 341/118, 144
See application file for complete search history.

(56) References Cited

U.S. PATENT DOCUMENTS

| | | | |
|---|---|---|---|
| 4,535,380 A * | 8/1985 | Geary | F23Q 3/004 315/209 SC |
| 5,221,905 A * | 6/1993 | Bhangu | G01R 31/041 324/538 |
| 6,462,687 B1 | 10/2002 | Eshraghi | |
| 7,414,557 B2 | 8/2008 | Andersson et al. | |
| 2008/0290811 A1 * | 11/2008 | Yoshida | H02M 3/156 315/225 |
| 2010/0013566 A1 * | 1/2010 | Kim | H03K 4/502 331/111 |
| 2014/0239847 A1 * | 8/2014 | Kim | H05B 33/0818 315/297 |
| 2015/0216012 A1 * | 7/2015 | Nagasaka | H05B 33/0818 315/224 |

OTHER PUBLICATIONS

Farahat, A., "Electronic Components"; http://www.engineering-bachelors-degree-com/electronic-components/page/312/; downloaded Sep. 14, 2017.
Gupta, A., "What's the Difference Between Continuous-Time and Discrete-Time Delta-Sigma ADCs?"; Electronic Design.com; May 29, 2014.
Perelman, Y., "A Low-Power Inverted Ladder D/A Converter"; IEEE Transactions on Circuits and Systems-II: Express Briefs, vol. 53, No. 6, Jun. 2006.
Rajan. R, "Device Noise in Continuous-time ΔΣ Modulators With Switched-Capacitor Feedback DACs"; Indian Institute of Technology; IEEE 2012.

* cited by examiner

*Primary Examiner* — Lam T Mai
(74) *Attorney, Agent, or Firm* — David G. Dolezal

(57) ABSTRACT

A digital to analog converter (DAC) circuit includes pulse generator circuit for generating voltage pulses having a predetermined length and shape. The voltage pulses are used to control the generation of current pulses generated by a voltage to current converter. The voltage to current converter includes a set of switchable resistors where the resistance value provided by the set is dependent upon a digital value of a digital signal. In some embodiments, the current amplitude of the current pulses is dependent upon the resistance value and is indicative of the digital value.

21 Claims, 3 Drawing Sheets

US 10,033,399 B1

DIGITAL TO ANALOG CONVERTER

BACKGROUND OF THE INVENTION

Field of the Invention

This invention relates in general to digital to analog converters.

Description of the Related Art

Digital to analog converters are used in electronic systems to convert a digital signal to an analog signal. For example, a digital to analog signal can be used in the feedback loop of an analog to digital converter circuit where the digital output is provided to a feedback node of a digital to analog converter circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a digital to analog converter (DAC) circuit includes pulse generator circuit for generating voltage pulses having a predetermined length and shape. The voltage pulses are used to control the generation of current pulses generated by a voltage to current converter. The voltage to current converter includes a set of switchable resistors where the resistance value provided by the set is dependent upon a digital value of a digital signal. The current amplitude of the current pulses is dependent upon the resistance value and is indicative of the digital value.

In some embodiments, the voltage pulses generated by the pulse generator include an edge that is not clock defined. With some embodiments, the edge is characterized as a slew rate controlled pulse edge whose rate of change is independent of a clock edge. In some embodiments, the slew rate of the edge is defined by a capacitor/reference current circuit of the pulse generator circuit. One advantage of utilizing voltage pulses with slew rate controlled pulse edge is that current pulses of a predetermined length and shape can be generated while minimizing clock jitter due to statistical variations of the clock edges.

Figure 1:
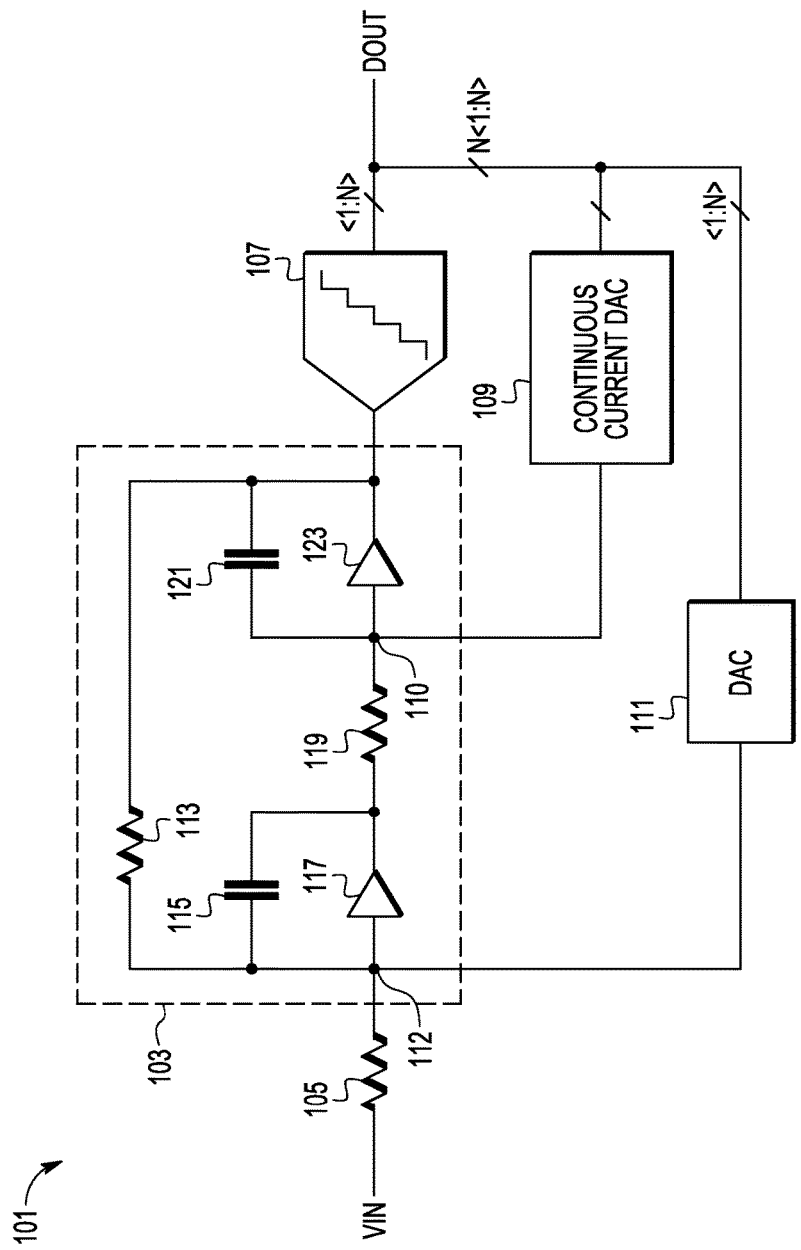
FIG. 1 is a circuit diagram of an analog to digital converter circuit according to one embodiment of the present invention.

FIG. 1 is a circuit diagram of an analog to digital converter (ADC) circuit 101 according to one embodiment of the present invention. Circuit 101 includes an input that receives an analog voltage signal (VIN) and an output for providing a digital signal (DOUT) having a digital value representative of the voltage level of the analog signal. Circuit 101 includes a resistive element 105 for converting the voltage signal VIN to the current domain. In the embodiment shown, circuit 101 includes filter circuitry 103 that includes resistors 113 and 119, capacitors 115 and 121, and amplifiers 117 and 123 for implementing continuous time RC filters for improving the quantization noise shaping and SQNR of the ADC circuit. The output of circuitry 103 is provided to a quantizer 107. Quantizer 107 receives at its input, a filtered analog signal in the current domain and provides at its output a digital signal (DOUT) having a value that is indicative of the voltage level of signal VIN. In one embodiment, quantizer quantizes the input signal to one of a number of discreet digital values each representative of a range of voltage levels of VIN. In one embodiment, the number of discrete values of quantizer 107 is 16, but in other embodiments, quantizer 107 may produce a different number of discrete values.

In one embodiment, the digital values produced by quantizer 107 as the digital output signal (DOUT) are encoded by thermometer code. In one embodiment, the thermometer code utilized represents both positive and negative analog values of the differential voltage. In other embodiments, the digital values may be encoded by another encoding scheme such as a binary code.

In the embodiment shown, circuit 101 includes two feedback loops that feedback an analog representation of the digital output signal (DOUT) to feedback nodes of the filter circuitry 103 to implement a $2^{nd}$ order continuous time, sigma delta feedback topology. The first feedback loop includes a continuous current DAC circuit 109 that converters the digital output signal (DOUT) to an analog signal that is fed back to feedback node 110. In one embodiment, the output analog signal of circuit 109 is a nonreturn to zero current analog signal. However, the feedback circuit may include other types of DAC circuits in other embodiments.

The second feedback loop includes DAC circuit 111 whose output is provided to feedback node 112. In one embodiment, DAC circuit 111 is characterized as a pulsed shaped non-continuous, return to zero, current DAC circuit whose output is a pulsed current signal. Additional details about an embodiment of circuit 111 are provided below in the description of FIGS. 2 and 3.

In an embodiment of FIG. 1, the analog signals (e.g. VIN, the feedback signals provided to feedback nodes 112 and 110, and the input signal to quantizer 107) of circuit 101 are differential signals where the analog inputs, outputs, and nodes each include two input terminals, output terminals, or node terminals. However, in other embodiments, they may be single ended signals.

In other embodiments, an ADC circuit may include other types of circuits and/or have other configurations. For example, in some embodiments, an ADC circuit may have a $3^{rd}$ order, feed forward, continuous time configuration that includes three continuous time filters whose outputs are summed by a summing amplifier (not shown) before being quantized. In one example of such an embodiment, the ADC circuit includes only one feedback path with a DAC circuit similar to DAC circuit 111.

Figure 2:
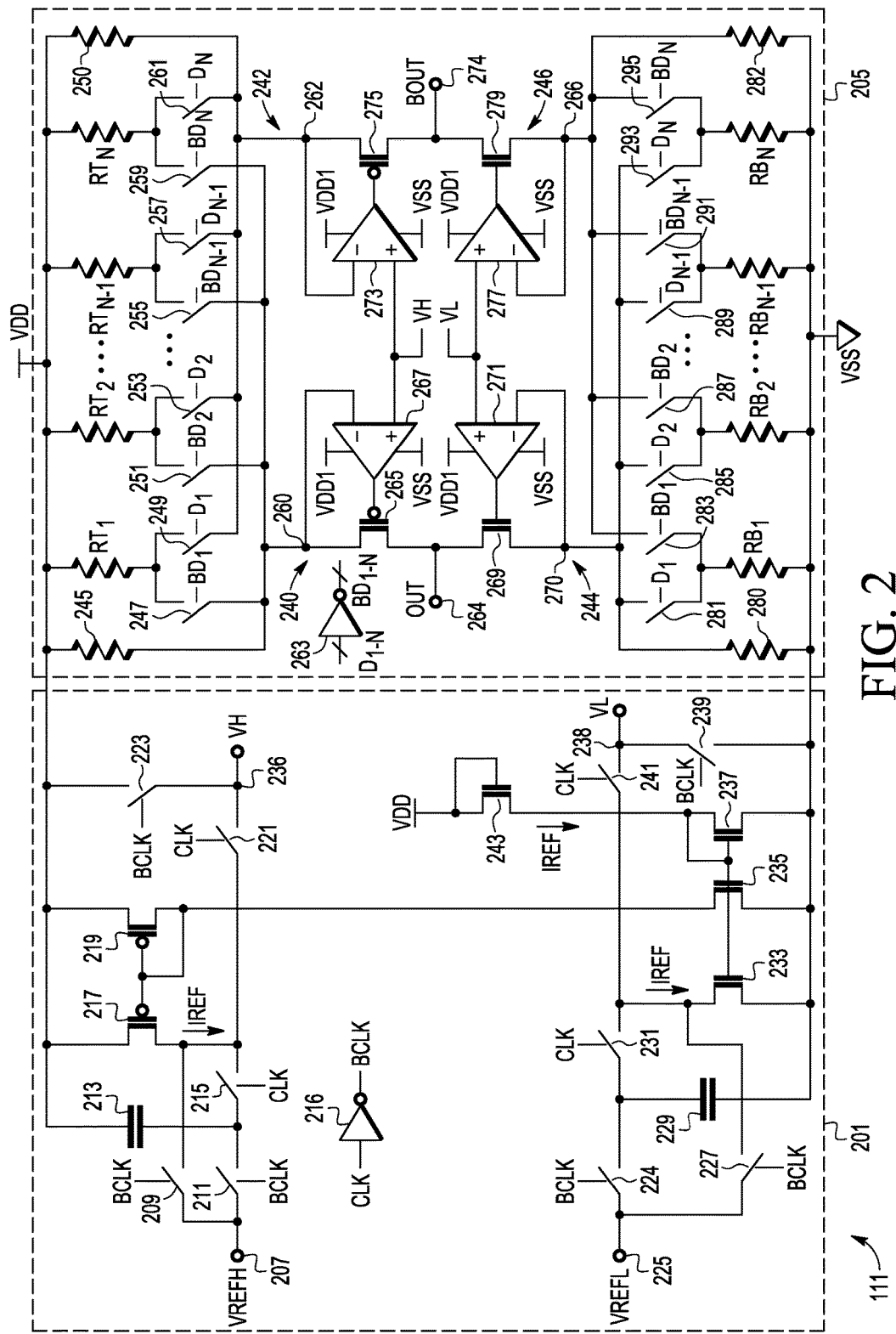
FIG. 2 is a circuit diagram of a digital to analog converter circuit according to one embodiment of the present invention.

FIG. 2 is a circuit diagram of DAC circuit 111 according to one embodiment of the present invention. Circuit 111 includes a pulse generation circuit 201 and a voltage to current circuit 205.

In the embodiment shown, pulse generation circuit 201 produces two pulse signals, VH which is referenced to the high voltage power supply terminal VDD and VL which is referenced to the low voltage power supply terminal VSS. In one embodiment, VDD is 1 volt and VSS is ground, but these may be of different voltages in other embodiments. Voltage pulse signals VH and VL each include voltage pulse having one edge defined by a clock signal (CLK) which is received by circuit 201. The other edge of the pulses of pulse signals VH and VL are defined by a reference current circuit and a capacitor. In the embodiment shown, circuit 201 utilizes separate capacitors for producing pulse signal VH (capacitor 213) and pulse signal VL (capacitor 229).

In the embodiment shown, a reference current circuit is implemented as a diode configured NFET transistor 243 that produces a reference current $I_{REF}$. However, the reference current may be generated by other circuitry in other embodiments. Circuit 201 implements one current mirror that includes NFET transistors 235 and 237 and PFET transistors 217 and 219 for providing the $I_{REF}$ current for generating the VH pulse signal and another current mirror that includes NFET transistors 237 and 233 for providing the $I_{REF}$ current for generating the VL pulse signal. Circuit 201 includes a reference voltage terminal 207 for receiving a reference voltage VREFH for charging capacitor 213 in generating the VH pulse signal and a reference voltage terminal 225 for receiving a reference voltage VREFL for charging capacitor 229 in generating the VL pulse signal. In one embodiment, VREFH is less than VDD and VREFL is greater than VSS.

Pulse generation circuit 201 includes a number of switches. Switches 231, 241, 215, and 221 are controlled by the clock signal (CLK) and are closed when the clock signal (CLK) is at a high voltage clock state and open when at a low voltage clock state. Switches 211, 209, 223, 224, 227, and 239 are controlled by an inverse clock signal (BLCK) which is an inverse of clock signal CLK and is produced by inverter 206. These switches are utilized to implement pre-charge and discharge phases of circuit 201 for generating the voltage pulse signals VH and VL. See the description of FIG. 3 below for further explanation. In one embodiment, at least some of these switches are implemented as transmission gates, but maybe implemented as other types of switches (e.g. NFETs, PFETs, other types of transistors) in other embodiments.

Current to voltage circuit 205 includes two output terminals 264 and 274 for providing a differential analog current pulse signal (OUT and BOUT) whose current amplitude of the pulses is indicative of the digital value of the digital signal $(D_{1-N})$ received from quantizer 107. Referring back to FIG. 1, the analog current pulse signal (OUT and BOUT) is provided to node 112 and the digital signal $(D_{1-N})$ is the DOUT signal.

In producing the differential current pulse signal (OUT and BOUT), the embodiment of FIG. 2 includes four source current paths, path 240, path 242, path 244, and path 246. Each source current path produces current for one of the differential output signals (OUT, BOUT). Path 240 includes transistor 265 whose drain is connected to output terminal 264. Path 242 includes transistor 275 whose drain is connected to output terminal 274. Path 244 includes transistor 269 whose drain is connected to output terminal 264. Path 246 includes transistor 279 whose drain is connected to output terminal 274. The conductivity of transistor 269 is controlled by amplifier 271, the conductivity of transistor 279 is controlled by amplifier 277, the conductivity of transistor 265 is controlled by amplifier 267, and the conductivity of transistor 275 is controlled by amplifier 273. The VH pulse signal is provided to the non-inverting terminals of amplifiers 267 and 273, and the VL pulse signal is provided to the non-inverting terminals of amplifiers 271 and 277. The upper power supply terminals of amplifiers 267, 271, 273, and 277 are connected to power supply voltage terminal VDD1, which is the same voltage or higher than the voltage of power supply terminal VDD. The lower power supply terminals of amplifiers 267, 271, 273, and 277 are connected to VSS, but may be connected to a lower voltage source in other embodiments. Amplifiers 267, 271, 273, and 277 are configured in a negative feedback configuration such that the VH pulse signal is replicated at nodes 260 and 262 by controlling transistors 265 and 275, and the VL pulse signal is replicated at nodes 270 and 266 by controlling transistors 269 and 279.

In the embodiment shown, circuit 205 includes two sets of switchable resistors. A "top" set includes switchable resistors $RT_1$, $RT_2$, $RT_{N-1}$, and $RT_N$ and a "bottom" set includes switchable resistors $RB_1$, $RB_2$, $RB_{N-1}$, and $RB_N$. N is the number of digital signal lines $(D_1-D_N)$ of the digital signal. In one embodiment, N is 16, but can be of another number in other embodiments.

In the embodiment shown, the sets of switchable resistors each include switches for selectively coupling the resistors to a source current path. In the embodiment shown, each resistor of the top set is coupled by one switch to source current path 240 and by a second switch to source current path 242. For each resistor of the top set, one of the two switches for coupling to the paths 240 or 242 is controlled by a signal line $(D_1-D_N)$ of the digital signal $(D_{1-N})$ and the other of the two switches is controlled by a signal line $(BD_1-BD_N)$ of an inverse digital signal $(BD_{1-N})$, which is an inverse digital signal of digital signal $(D_{1-N})$. The top set of resistors $(RT_1, RT_2, RT_{N-1}, $ and $RT_N)$ are coupled to path 240 by switches (247, 251, 255, and 259), which are controlled by the inverse digital signal $(BD_{1-N})$ and are coupled to path 242 by switches (249, 253, 257, and 261), which are controlled by the digital signal $(D_{1-N})$. The bottom set of resistors $(RB_1, RB_2, RB_{N-1}, $ and $RB_N)$, are coupled to source current path 244 by switches (281, 285, 289, and 293), which are controlled by the digital signal $(D_{1-N})$, and are coupled to source current path 246 by switches (283, 287, 291, and 295), which are controlled by the inverse digital signal $(BD_{1-N})$.

The inverse digital signal $(BD_{1-N})$ is provided by inverter set 263 whose inputs are the signal lines $(D_1-D_N)$ of the digital signal $(D_{1-N})$. In other embodiments, the digital signal (DOUT) provided by quantizer 107 may be a differential digital signal that includes signal lines $(D_1-D_N)$ and $(BD_1-BD_N)$. In the embodiment shown, because each the pair of switches for each resistor of the top set and the bottom set are controlled by a particular signal line and the inverse of that particular signal line, only one set of top resistors is needed for both paths 240 and 242 and only one set of bottom resistors is needed for both paths 244 and 246 in that both switches cannot be closed at the same time. For example, switches 247 and 249 cannot be closed at the same time. However, in other embodiments, each path may include its own set of resistors.

In one embodiment, the switches are implemented by transmission gates, but may be implemented by other types of switches in other embodiments. Nonswitchable resistors 280, 245, 282, and 250 are coupled to paths 244, 240, 246, and 242, respectively.

Figure 3:
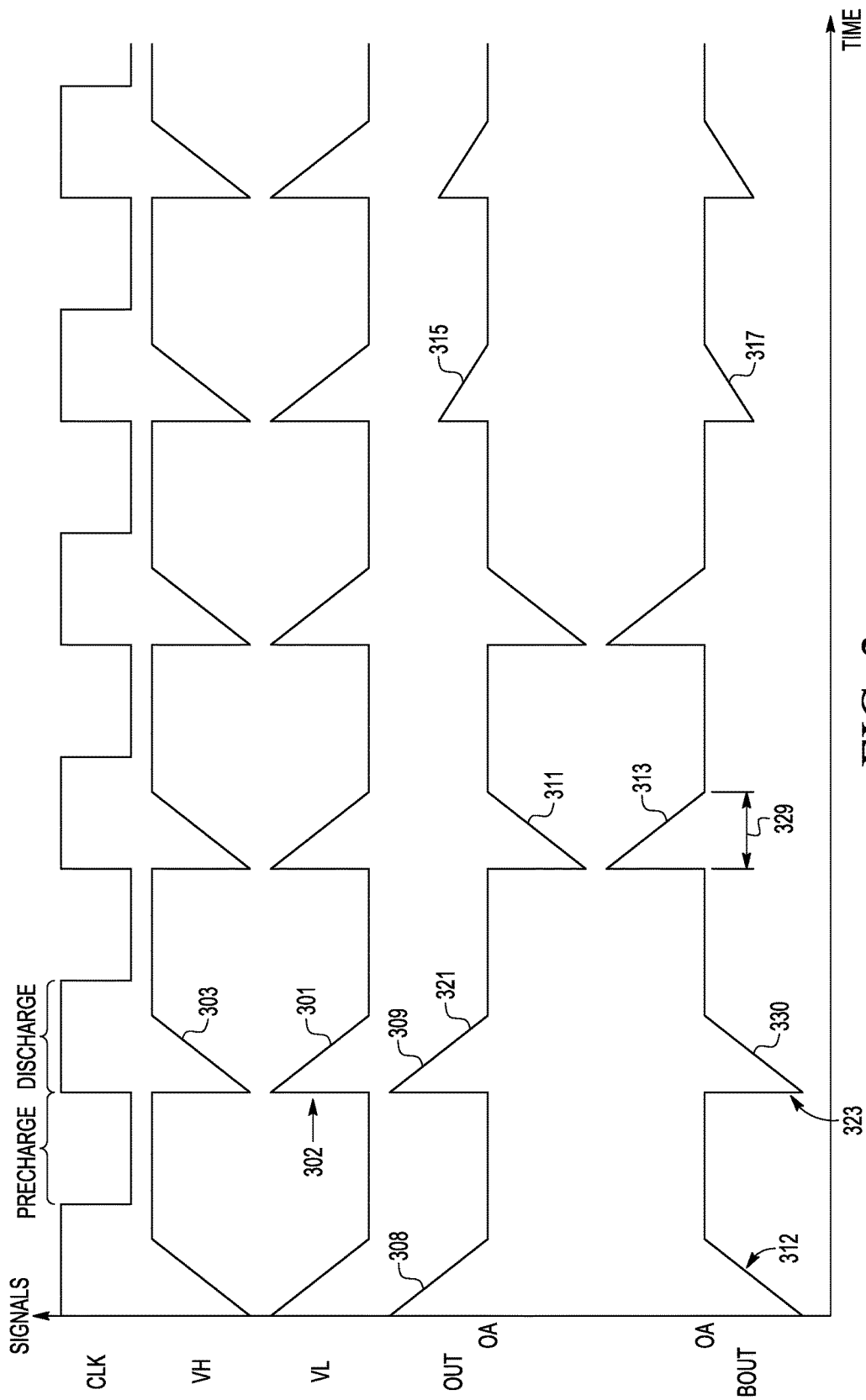
FIG. 3 is a timing diagram showing the operations of a digital to analog converter circuit according to one embodiment of the present invention.

FIG. 3 is a timing diagram of signals produced by circuit 111. The pulse generator circuit 201 operates under alternating precharge and discharge phases (as determined by the state of the clock signal (CLK)) in producing the pulse signals VH and VL. During a precharge phase, clock signal (CLK) is low to open switches 231 and 241 and the BCLK signal is high to close switches 224, 227, and 239. The BCLK signal is not shown in FIG. 3 but is an inverse of the CLK signal. During the precharge phase, capacitor 229 is charged to the VREFL voltage and signal VL is low because node 238 is pulled to VSS through closed switch 239. Upon a subsequent rising edge of the CLK signal, switches 239, 224, and 227 open and switches 231 and 241 close to short node 238 to capacitor 229. Because capacitor 229 is charged to VREFL, the voltage of node 238 (the output producing the pulse signal VL) is pulled to VREFL upon the rising edge of the CLK signal. During the discharge phase, the voltage at node 238 (signal VL) decays at a controlled rate due to the controlled discharge of capacitor 229 through transistor 233 at the reference current IREF. Accordingly, the falling edge 301 of signal VL has a shape (and a slew rate) controlled by the capacitance of capacitor 229 and current IREF. Because the changing of the pulse states of edge 301 is determined by the capacitance of capacitor 229 and current IREF, edge 301 is characterized as a slew rate controlled pulse edge whose rate of change is independent of a clock edge. In contrast, because rising edge 302 of the VL signal is caused by a clock signal closing switches 241 and 231 and opening switches 224, 227, and 239 to change pulse states, rising edge 302 is not a slew rate controlled pulse edge.

Regarding signal VH, during a precharge phase, clock signal (CLK) is low to open switches 215 and 221 and the BCLK signal is high to close switches 209, 211, and 223. During the precharge phase, capacitor 213 is charged to the VREFH voltage and signal VH is high because node 236 is pulled to VDD through closed switch 223. Upon a subsequent rising edge of the CLK signal, switches 209, 211, and 223 open and switches 215 and 221 close to short node 236 to capacitor 213. Because capacitor 213 is charged to VREFH, the voltage of node 236 (the output providing the pulse signal VH) is pulled to VREFH upon the rising edge of the clock signal (CLK). During the discharge phase, the voltage at node 236 (signal VH) increases due to the controlled discharge of capacitor 213 through transistor 217 at the reference current IREF. Accordingly, the rising edge 303 of signal VH has a shape (and slew rate) controlled by the capacitance of capacitor 213 and current IREF and is characterized as a slew rate controlled pulse edge.

The voltage to current circuit 205 converts the voltage pulse signals VH and VL to current pulse differential signals OUT and BOUT whose current pulse amplitudes are scaled according to the digital value of the digital signal $(D_{1-N})$. In one embodiment, the voltage amplitude of the OUT and BOUT signals is the same as the voltage amplitude of the pulses of the pulse signal VL and VH, but may be of different values in other embodiments.

During the precharge phase, VH is at a high voltage and VL is at a low voltage. Because amplifiers 267, 271, 273, and 277 are configured in a buffer configuration, transistors 265, 269, 275, and 279 are nonconducting at this time. At the beginning of a discharge phase, the voltage of node VH is pulled to a low voltage value and the voltage of node VL is pulled to a high voltage. Accordingly, at this time, transistors 265, 275, 269, and 279 are conductive. Also at this time, the peak current magnitude of the pulses of the OUT and BOUT signals are at their highest with the polarity of these signals dependent upon the resistive value of the top set of resistors $(RT_1, RT_2, RT_{N-1},$ and $RT_N)$ and the resistive value of the bottom set of resistors $(RB_1, RB_2, RB_{N-1},$ and $RB_N)$ as set by the digital signal $(D_{1-N})$.

The highest resistance value of each resistor set with respect to a current path is generated when none of the switchable resistors of the set are coupled to the current path. In such a condition, the resistance of the resistor set is the resistance of the nonswitchable resistor (245, 250, 280, and 282) coupled to the current path. The lowest resistance value of each resistor set with respect to a current path is generated when all of the switchable resistors of the set are coupled to the current path. In this case, the resistance of the path is equal to $1/\{(1/Rnonswitchable)+sum(1/Rswitchable_i)\}$. The other possible resistance values are at points in between the highest and lowest values, depending upon the number of closed switches of a resistor set coupled to a current path.

In the embodiment of FIG. 3, the current amplitude of the first two pulses (308 and 309) of the OUT signal are at a relatively high positive current value. Based on the embodiment of FIG. 2, a positive current of the OUT signal is generated when transistors 265 and 269 are conductive and the top resistor set has a low resistance value (as set by the inverse digital signal $(BD_{1-N})$) and the bottom resistance set has a high resistance value (as set by the digital signal $(D_{1-N})$). In such a condition, current is sourced (indicated by the positive current) from VDD to terminal 264. Conversely, a negative current of the BOUT signal (pulse 312) is generated when transistors 275 and 279 are conductive and the top resistor set has a high resistance value (as set by the digital signal $(D_{1-N})$) and the bottom resistance set has a low resistance value (as set by the inverse digital signal $(BD_{1-N})$). In such a condition, current is sunk to VSS from terminal 274 (indicated as negative current).

As the voltage of pulse signal VH rises due to the discharge of capacitor 213 and the voltage of signal VL decreases due to the discharge of capacitor 229, the conductivity of transistors 265, 275, 269, and 279 decreases, which causes the magnitude of the current of signals OUT and BOUT to decrease at a controlled rate as well until the voltage of VH increases above the threshold voltage of PFET transistors 265 and 275 and the voltage of VL decreases below the threshold voltage of NFET transistors 269 and 279 to where those transistors are no longer conductive.

Accordingly, providing shape defined edges for pulses VH and VL also provides for shape defined edges for current pulses OUT and BOUT. Because the trailing edges of the pulses of VH and VL are slew rate controlled pulse edges whose rate of change is independent of a clock edge, the trailing edges (321, 330) of pulses of the OUT and BOUT signals are slew rate controlled pulse edges whose rate of change is independent of a clock edge as well. Thus, because the trailing edge of the current pulses of output signal OUT and BOUT are not defined by a clock edge, clock-jitter-induced errors in the feedback signal (OUT and BOUT) provided to feedback node 112 can be minimized. In contrast, if the trailing edges of the OUT signal and the BOUT signal were clock defined (such as if both edges of the pulses of signals VH and VL were clock defined), the ADC circuit 101 may suffer from clock-jitter-induced errors due to the resulting statistical misalignment of the leading and falling edges of the OUT and BOUT signals.

Furthermore, because the current pulses of the OUT and BOUT signals return to zero current at the trailing edge before the next rising pulse edge, clock-jitter-induced errors are minimized as will in circuit 101. With such a configuration, the timing of the pulses at feedback node 112 is not critical as long as the average current of a current pulse signal is reflective of the desired feedback value.

In addition, because the voltage pulses of signals VH and VL, which are of a predetermined length and shape, control the conductivity of transistors 265, 275, 269, and 279, the current pulses of the OUT and BOUT signals are also of a predetermined length and shape (e.g. length 329). Thus, the length of the current pulses of the OUT and BOUT signals are independent of the magnitude of the current pulses. Accordingly, the clock rate of the DAC is not limited by the amplitude of the current pulses.

Furthermore, because the trailing edge of the pulses of the OUT and BOUT signals is controlled to be sloped to zero (as opposed to a circuit where the pulses of the OUT and BOUT signal abruptly return to zero), the summing node of the feedback amplifier is able to properly process the feedback pulse without the need for a wider bandwidth, higher gain, and higher slew rate amplifier in some embodiments.

Referring to FIG. 3, the current amplitude values of the pulses of the OUT and the BOUT signals vary over time with the changing digital values of the digital signal ($D_{N-1}$). In the embodiment shown, the digital values of the digital signal generated by quantizer 107 change every two clock cycles of the clock (CLK) signal. In other embodiments, the digital values of the digital signal may change at other clock intervals. In some embodiments, it is desirable to have the digital signal change digital values at the beginning of or during a discharge phase of circuit 111.

In FIG. 3, the current amplitude of the third pulse of the OUT an BOUT signals, pulses 311 and 313 respectively, each switch polarity from the previous current pulse of that signal (309 and 323). This is due to the digital value of digital signal ($D_{1-N}$) switching from a value where all or nearly all of the signal lines are at a low voltage state to a value where all or nearly all of the digital signal lines are at a high voltage state. In the latter condition, the pulse of the OUT signal is sunk from VSS and the pulse of the BOUT signal is sourced from VDD. The fourth pulses of the OUT and BOUT signals have the same current level as the third pulses 311 and 313, respectively.

In the embodiment shown, the fifth pulses 315 and 317 for the OUT signal and the BOUT signal, respectively, switch polarities again, but the current magnitudes of the pulses are at lower values. This is due to the digital signal ($D_{1-N}$) having a digital value where a majority, but not all, of the signal lines are at a low voltage state. The current amplitude for the sixth pulses of the OUT and BOUT signals do not change in the that digital value of the digital signal does not change.

DAC circuit 111 may include other circuitry and/or have other configurations in other embodiments. For example, in some embodiments, circuit 111 may produce a single ended analog signal (OUT), in which case circuit 205 would not include current paths 242 and 246 or the switches and other devices coupled thereto. In other embodiments, pulse generation circuit 201 only generates one voltage pulse signal (VL). In some of these embodiments, the generated voltage pulse signal would be inverted before being provided to amplifiers 267 and 273 to provide the VH signal. In still other of these embodiments, amplifiers 267 and 271 would be replaced by an amplifier with a differential output and amplifiers 273 and 277 could be replaced by an amplifier with a differential output. For each replacement amplifier, one of the differential outputs would be provided to the PFET and the other differential output would be provided to the NFET that is coupled to the PFET. Both replacement amplifiers would receive only one voltage pulse signal (VL).

In other embodiments, the current to voltage circuit 205 would only include the low set of resistors and not include the high set of resistors, PFET transistors 265 and 275, and amplifiers 267 and 273. In such an embodiment, the average current pulse would be less than zero. Likewise, in some embodiments, the low set of resistors, NFET transistors 269 and 279, and amplifiers 271 and 277 could be removed where the average current pulse would be greater than zero.

In some embodiments, the top and bottom sets of resistors may each include resistive values that are weighted. With such embodiments, the resistor sets can provide different resistive values based on a binary encoded digital signal. In another embodiment, the DAC circuit 111 may include a decoder to decode a digital signal that is binary encoded.

Features shown or described herein with respect to one embodiment may be implemented with other embodiments shown or described herein.

As described herein, a current terminal of a transistor being "directionally coupled" to another node or device means that the current terminal is coupled either directly or indirectly to the node or device by a path other than through the channel of the transistor of the current terminal or through a power supply terminal. For example, the source of transistor 269 is directionally coupled to switches 281 and 285 but is not directionally coupled to transistor 265 or resistor 282.

In one embodiment, a circuit includes a pulse generator circuit. The pulse generator circuit includes an output for providing a pulse signal of voltage pulses having a predetermined length and shape. The circuit includes a voltage to current circuit that includes a first input to receive the pulse signal, a second input to receive a digital signal having a digital value indicative of a voltage level, and a set of switchable resistive elements. A resistive value of the set is controlled by the digital value. The voltage to current circuit includes an output to provide an output pulse signal of current pulses generated from the pulse signal. A current amplitude of each current pulse of the output pulse signal is dependent upon the resistive value and is indicative of the digital value.

In another embodiment, a method includes generating a pulse signal with a plurality of voltage pulses. Each pulse of the plurality of voltage pulses having a predetermined length and a predetermined shape. The method includes providing the pulse signal to a voltage to current converter circuit, providing a digital signal indicative of a digital value to the voltage to current converter circuit, and using the digital signal to selectively enable switchable resistive elements of a set of switchable resistive elements to provide a resistive value based on the digital value of the digital signal. The method includes generating by the voltage to current converter, a current pulse signal from the pulse signal, where each pulse of the current pulse signal has a current amplitude based on the resistive value and indicative of the digital value.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:
1. A circuit comprising:
    a pulse generator circuit, the pulse generator circuit including an output for providing a pulse signal of voltage pulses having a predetermined length and shape;

a voltage to current circuit comprising:
   a first input to receive the pulse signal;
   a second input to receive a digital signal having a digital value indicative of a voltage level;
   a set of switchable resistive elements, wherein a resistive value of the set is controlled by the digital value;
   an output to provide an output pulse signal of current pulses generated from the pulse signal, wherein a current amplitude of each current pulse of the output pulse signal is dependent upon the resistive value and is indicative of the digital value.

2. The circuit of claim 1 wherein of each current pulse the output pulse signal is of a predetermined length.

3. The circuit of claim 1 wherein each voltage pulse of the pulse signal includes a pulse edge that is a slew rate controlled pulse edge whose rate of change is independent of a clock edge.

4. The circuit of claim 1 wherein the voltage to current circuit includes a transistor, a conductivity of the transistor is controlled by the pulse signal, the transistor including a first current terminal directionally coupled to the output of the voltage to current circuit and a second current terminal directionally coupled to the set of switchable resistive elements.

5. The circuit of claim 4 wherein the transistor is conductive during a pulse of the pulse signal, wherein an amount of current flowing through the transistor when conductive is dependent upon the resistive value of the set of switchable resistive elements.

6. The circuit of claim 4 wherein the voltage to current circuit includes:
   a second set of switchable resistive elements, wherein a resistive value of the second set is controlled by the digital value;
   a second transistor, the second transistor including a first current terminal directionally coupled to the output of the voltage to current circuit, and a second current terminal directionally coupled to the second set of switchable resistive elements, the second transistor is coupled in series with the transistor.

7. The circuit of claim 6 wherein an amount of current flowing through the second transistor when conductive is dependent upon the resistive value of the second set of switchable resistive elements and the resistive value of the set of switchable resistive elements.

8. The circuit of claim 6 wherein a conductivity of the second transistor is controlled by a second pulse signal that is an inverse signal of the pulse signal.

9. The circuit of claim 8, wherein a length of the voltage pulses of the pulse signal and a length of voltage pulses of the second pulse signal are each dependent upon a current produced by a reference current circuit.

10. The circuit of claim 4 wherein the voltage to current circuit includes:
   a second transistor;
   wherein the output of the voltage to current circuit is a differential output including a first output terminal and a second output terminal, the second output terminal being a differential terminal to the first output terminal;
   the second transistor including a first current terminal directionally coupled to the second output terminal and a second current terminal directionally coupled to the set of switchable resistive elements, a conductivity of the second transistor controlled by the pulse signal;
   wherein the first current terminal of the transistor is directionally coupled to the first output terminal.

11. The circuit of claim 4 wherein the voltage to current generator circuit includes an amplifier having an input to receive the pulse signal and an output coupled to a control terminal of the transistor for controlling the conductivity of the transistor.

12. The circuit of claim 1 wherein the pulse generator circuit includes a capacitor and a reference current circuit, wherein the predetermined length of the voltage pulses is dependent upon a capacitance of the capacitor and an amount of reference current produced by the reference current circuit.

13. The circuit of claim 1 wherein the pulse generator circuit includes a capacitor and a reference current circuit, wherein the voltage pulses of the pulse signal have a controlled edge, wherein a slew rate of the controlled edge is defined by a capacitance of the capacitor and an amount of reference current produced by the reference current circuit.

14. The circuit of claim 1 wherein the voltage pulses of the pulse signal have a controlled edge whose slew rate is dependent upon a reference current.

15. The circuit of claim 1 wherein the pulse generator circuit includes a precharge phase for charging a capacitor of the pulse generator circuit and a discharge phase for discharging the capacitor, wherein pulses of the pulse signal do not occur during the precharge phase.

16. The circuit of claim 1 wherein the output pulse signal is characterized as a return to zero signal.

17. The circuit of claim 1 further comprising:
   an analog to digital convertor including:
      an input to receive an analog voltage signal;
      an output to provide the digital signal, the digital value indicative of a voltage level of the analog voltage signal;
      a feedback circuit including the pulse generator circuit and the voltage to current circuit, the analog to digital converter uses the output pulse signal of the voltage to current circuit to adjust the digital signal.

18. A method comprising:
   generating a pulse signal with a plurality of voltage pulses, each pulse of the plurality of voltage pulses having a predetermined length and a predetermined shape;
   providing the pulse signal to a voltage to current converter circuit;
   providing a digital signal indicative of a digital value to the voltage to current converter circuit;
   using the digital signal to selectively enable switchable resistive elements of a set of switchable resistive elements to provide a resistive value based on the digital value of the digital signal;
   generating by the voltage to current converter, a current pulse signal from the pulse signal, where each pulse of the current pulse signal has a current amplitude based on the resistive value and indicative of the digital value.

19. The method claim of claim 15 wherein the generating the current pulse signal includes using the pulse signal to control a conductivity of a transistor having a first current terminal directionally coupled to an output of the voltage to current convertor that provides the current pulse signal and a second current terminal directionally coupled to the set of switchable resistive elements.

20. The method of claim 18 wherein each pulse of the current pulse signal is of a predetermined length.

21. The method of claim 18 wherein each pulse of the plurality of voltage pulses includes a pulse edge that is characterized as a slew rate controlled pulse edge whose rate of change is independent of a clock edge.

* * * * *